(12) United States Patent
Huott et al.

(10) Patent No.: US 7,319,348 B2
(45) Date of Patent: Jan. 15, 2008

(54) CIRCUITS FOR LOCALLY GENERATING NON-INTEGRAL DIVIDED CLOCKS WITH CENTRALIZED STATE MACHINES

(75) Inventors: William V. Huott, Holmes, NY (US); Charlie C. Hwang, Hopewell Junction, NY (US); Timothy C. McNamara, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 11/341,032

(22) Filed: Jan. 27, 2006

(65) Prior Publication Data

US 2007/0176651 A1    Aug. 2, 2007

(51) Int. Cl.
*G06F 1/04* (2006.01)
(52) U.S. Cl. ..................... 327/115; 327/291
(58) Field of Classification Search ............... 327/115, 327/117, 291–299; 377/47–48
See application file for complete search history.

(56) References Cited

U.S. PATENT DOCUMENTS

| | | | |
|---|---|---|---|
| 5,416,443 A | 5/1995 | Cranford, Jr. et al. ........ 331/2 |
| 5,596,765 A | 1/1997 | Baum et al. ................. 395/800 |
| 5,926,053 A * | 7/1999 | McDermott et al. ........ 327/298 |
| 6,134,670 A | 10/2000 | Mahalingaiah ............... 713/401 |
| 6,272,646 B1 | 8/2001 | Rangasayee ................. 713/500 |
| 6,326,812 B1 | 12/2001 | Jefferson ..................... 326/93 |
| 6,550,013 B1 | 4/2003 | Gervais et al. ............. 713/501 |
| 6,583,648 B1 | 6/2003 | Cai ............................. 326/73 |
| 6,611,920 B1 | 8/2003 | Fletcher et al. ............. 713/322 |

OTHER PUBLICATIONS

Japanese Patent, "Patent Abstracts of Japan", (C) 1994, JPO & Japio.

* cited by examiner

*Primary Examiner*—Linh My Nguyen
(74) *Attorney, Agent, or Firm*—Cantor Colburn LLP; Lynn Augspurger (57) ABSTRACT

Circuitry for locally generating a ratio clock on a chip. The circuitry includes circuitry for generating a global clock signal having a global clock cycle. A state machine includes a counter going through a complete cycle in response to a non-integer number of global clock cycles. The state machine generates a control signal in response to the counter. Staging latches receive the control signal and generate a clock high signal and a clock low signal, the clock high signal and the clock low signal having patterns derived from a waveform of a target divided ratio clock, the clock high signal and the clock low signals have patterns that match the targeted divided clock frequency and duty cycle. A local pass gate receives the clock low signal and the clock high signal and generates an (n+0.5)-to-1 clock signal in response to the global clock signal, the clock high signal and the clock low signal.

15 Claims, 13 Drawing Sheets

FIG. 1
CENTRALIZED STATE MACHINES

FIG. 2
CONNECTION BETWEEN CENTRALIZED STATE MACHINE AND LOCAL STAGING LATCHES AND LOGIC

FIG. 3
STAGING LATCHES AND LOGIC (LOCAL OR CENTRALIZED)

FIG. 4

PASSGATES (LOCAL AT CLOCK GENERATION CIRCUIT)

FIG. 5
1.5-to-1 clock, achievable dutycycle

FIG. 6
Determine clkl and clkh

FIG. 7
Determine relationship between clkl and clkh determine control signal

FIG. 8

STAGING LATCHES AND LOGIC FOR 1.5-TO-1 CLOCK GENERATION

FIG. 9
PROGRAMMABLE RATIO CLOCK GENERATION CIRCUIT

FIG. 10
33.3% DUTY CYCLE 1.5-to-1 CLOCK

FIG. 11
1.5-to-1 CLOCK WITH 3 STAGING LATCHES

FIG. 12
1.5-to-1 CLOCK WITH 2 STAGING LATCHES
ASSUMING ONLY FALLING EDGE OF THE CLOCK IS CRITICAL

FIG. 13

CIRCUITS FOR LOCALLY GENERATING NON-INTEGRAL DIVIDED CLOCKS WITH CENTRALIZED STATE MACHINES

BACKGROUND OF THE INVENTION

1. Field of the Invention

This invention relates to generating a ratio clock signal using a global clock signal. More particularly, this invention relates to generating a ratio clock signal at any integer divided by two of a global clock signal.

2. Description of Background

This application is related to U.S. patent application, filed concurrently with this patent application, entitled "Method for Locally Generating Non-Integral Divided Clocks with Centralized State Machines," Ser. No. 11/341,038, having William V. Huott, Charlie C. Hwang and Timothy G. McNamara and as named inventors, the entire contents of which are incorporated herein by reference.

It is common for an integrated circuit chip (chip) to operate with multiple different clock speeds. Often, chip architecture allows different regions of the chip to have different clock speeds. To achieve multiple different clock speeds, a chip may employ multiple clock grids throughout the entire chip with each clock grid producing a distinct clock speed. However, employing multiple clock grids creates additional expense for chip production. Higher clock skews between clocks of different clock grids may reduce the maximum clock speed and reduce chip performance. Thus, to keep costs down and keep chip performance up, it has been common practice to use a single clock grid to generate a global clock and obtain different clock speeds by developing ratio clock speeds at a specific ratio to the global clock.

It is common to use external control signals to develop derivative clock speeds at a ratio to the global clock. Additionally, absent external control signals, derivative clock speeds are generally limited to having whole number ratios to the global clock of, for example, 2-to-1, 4-to-1, etc. Generally, there is known in the art circuits which centrally generate clocks with multiple frequencies or phases with multiple phase locked loops, and which use an integral divider. Additionally, complex circuits used to generate derivative clock speeds may create a time delay between the global clock and the derivative clock.

An existing solution is provided in U.S. patent application Ser. No. 11/056,024, the entire contents of which are incorporated herein by reference. This application describes a circuit and power device for a local state machine, which while well suited for its intended purpose, is primarily effective when there are only a few local circuits. However, there are embodiments where a high number of circuits use a non-integral divided clock locally. Thus, there is a need for a more compact solution than that described in U.S. patent application Ser. No. 11/056,024.

SUMMARY OF THE INVENTION

Embodiments include circuitry for locally generating a ratio clock on a chip. The circuitry includes circuitry for generating a global clock signal having a global clock cycle. A state machine includes a counter going through a complete cycle in response to a non-integer number of global clock cycles. The state machine generates a control signal in response to the counter. Staging latches receive the control signal and generate a clock high signal and a clock low signal, the clock high signal and the clock low signal having patterns derived from a waveform of a target divided ratio clock, the clock high signal and the clock low signals have patterns that match the targeted divided clock frequency and duty cycle. A local pass gate receives the clock low signal and the clock high signal and generates an (n+0.5)-to-1 clock signal in response to the global clock signal, the clock high signal and the clock low signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution that provides for generation of an (n+0.5)-to-1 ratio clock signal by providing a control signal to staging latches and combination logic. This allows the duty cycle of the ratio clock to be controlled by the control signal.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 13:
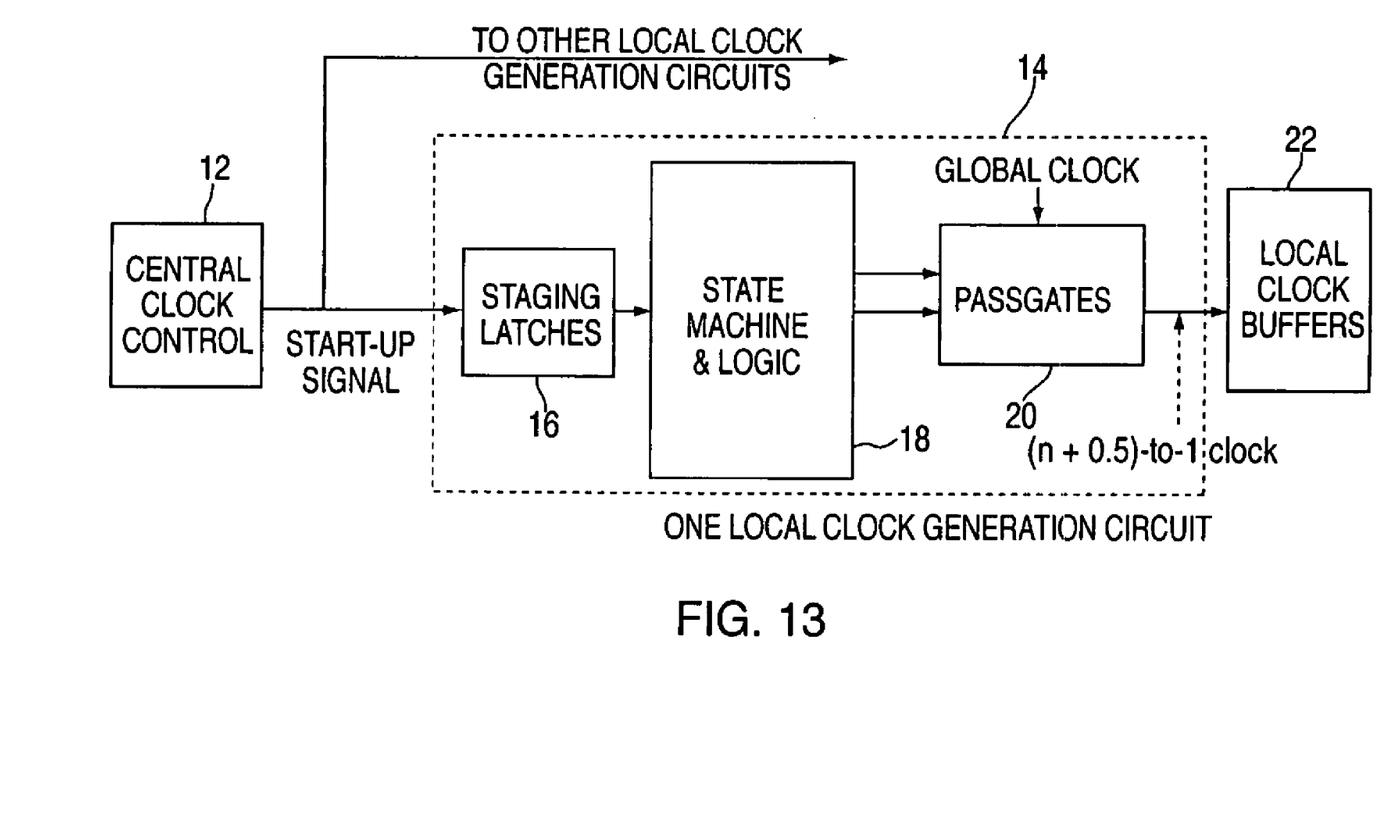
FIG. 13 illustrates a block diagram of an existing ratio clock generator.

FIG. 13 illustrates a block diagram of an existing ratio clock generator, such as that described in U.S. patent application Ser. No. 11/056,024. FIG. 13 shows a centralized clock control 12 that provides a start-up signal to a local clock generation circuit 14. The local clock generation circuit 14 includes staging latches 16, state machine and logic 18 and passgates 20. The output of the passgates 20 is the (n+0.5)-to-1 clock signal. Local clock buffers 22 store the clock signals for local devices.

Figure 1:
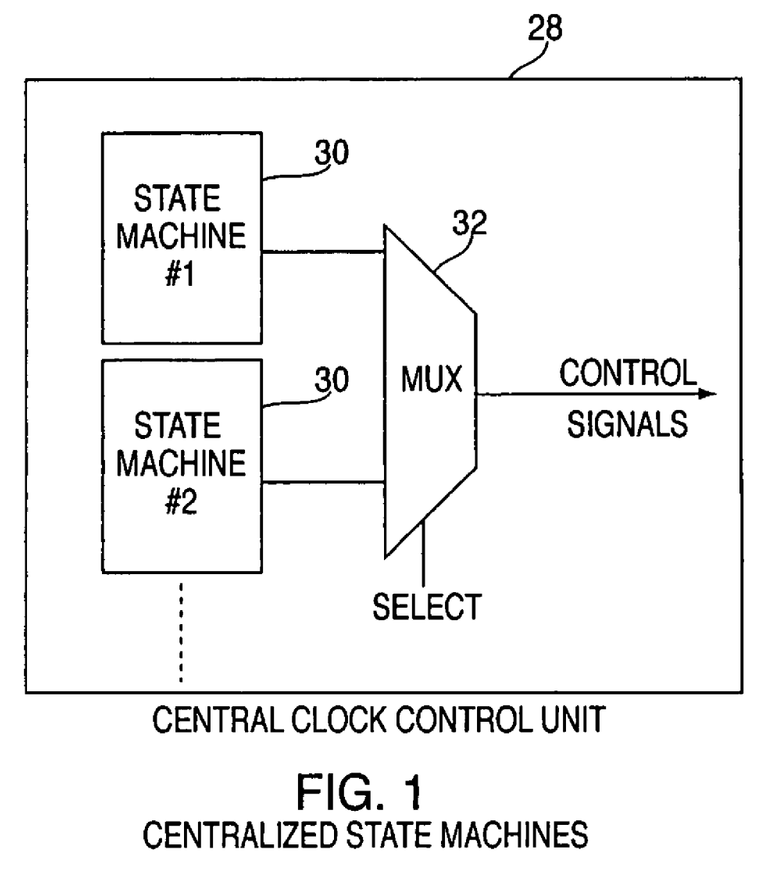
FIG. 1 illustrates one example of multiple state machines in the central control unit for control signal generation.

Circuits used to provide a ratio clock generator are now described with reference to FIGS. 1-12. FIG. 1 depicts centralized state machines 30 that generate clock control signals. The control signals are generated centrally from the centralized state machines 30 and may be reconfigurable from external controls. One example is to generate different control signal patterns from a clock control unit 28 using multiple state machines 30 and select control signal patterns through a multiplexer 32. The state machine 30 could be a simple counter or a counter with some logic depending on the control patterns required.

As described in co-pending application Ser. No. 11/056,024 the state machine 30 may employ counters to increment logic states as described in U.S. patent application Ser. No. 11/056,024. In exemplary methods, the state machine creates a "count-to-three counter" that counts in binary, for example, 0, 1, 2, 0, 1, etc. The count-to-three counter passes through (counts) three incremental logic states twice during three complete clock cycles of a global clock. Therefore, the output of the count-to-three counter goes through a complete cycle every one and one-half global clock cycles (or a 1.5-to-1 ratio). In general, the control signal can have a non-integer number of cycles in response to a single global clock cycle.

Figure 2:
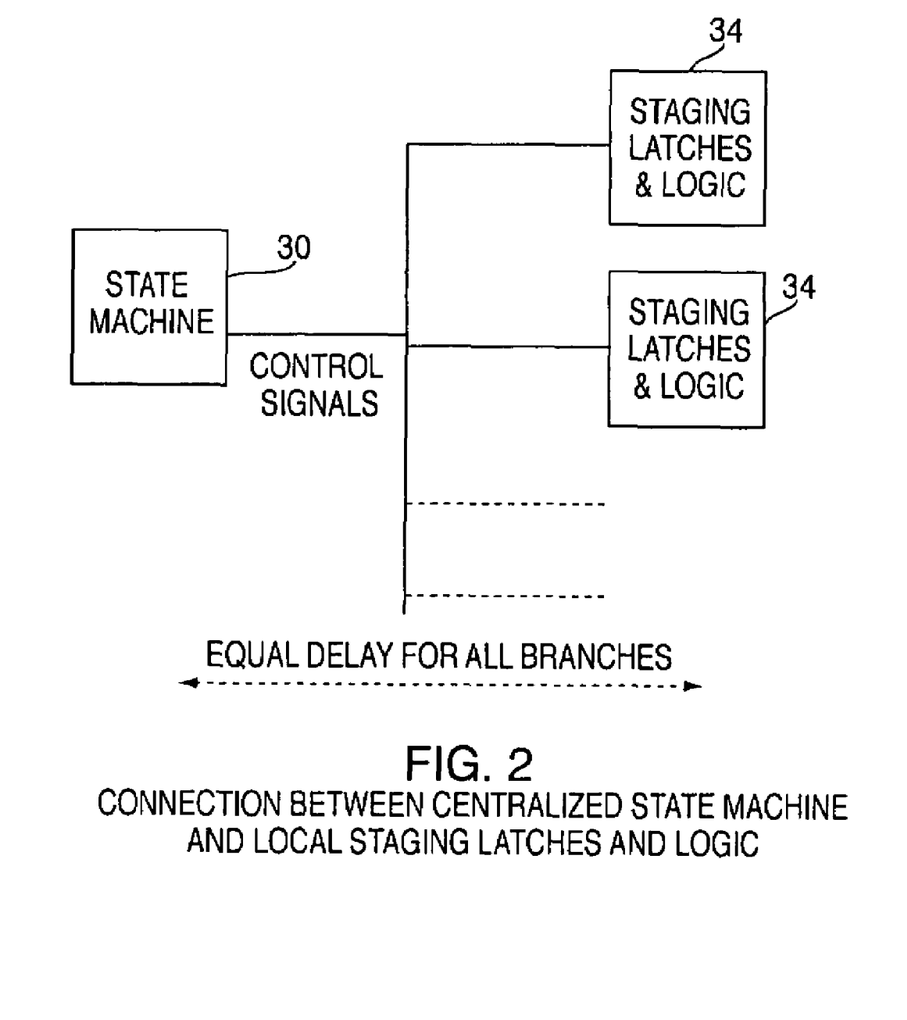
FIG. 2 illustrates a connection between a centralized state machine and local staging latches and logic.

FIG. 2 illustrates a connection between a centralized state machine 30 and local staging latches and logic 34 in alternate embodiments. The control signals sent from the state machine 30 are distributed through a tree like structure to the local staging latches and logic 34. The control signals are periodic patterns, which contain timing information. The delay is equalized between the state machine 30 and the staging latches and logic 34 for all branches so all staging latches and logic are synchronized properly.

Figure 3:
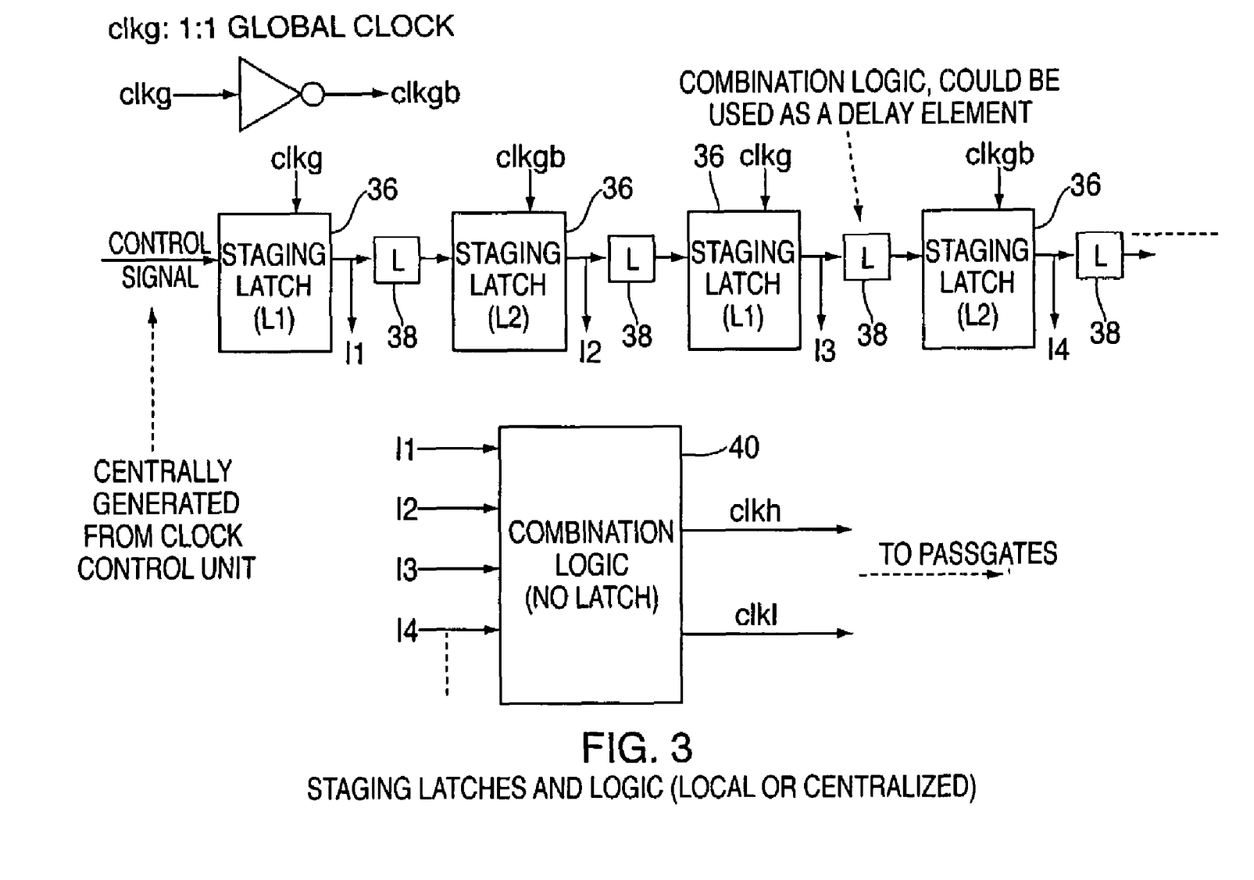
FIG. 3 illustrates one example of staging latches and logic for (n+0.5)-to-1 clock generation.
Figure 4:
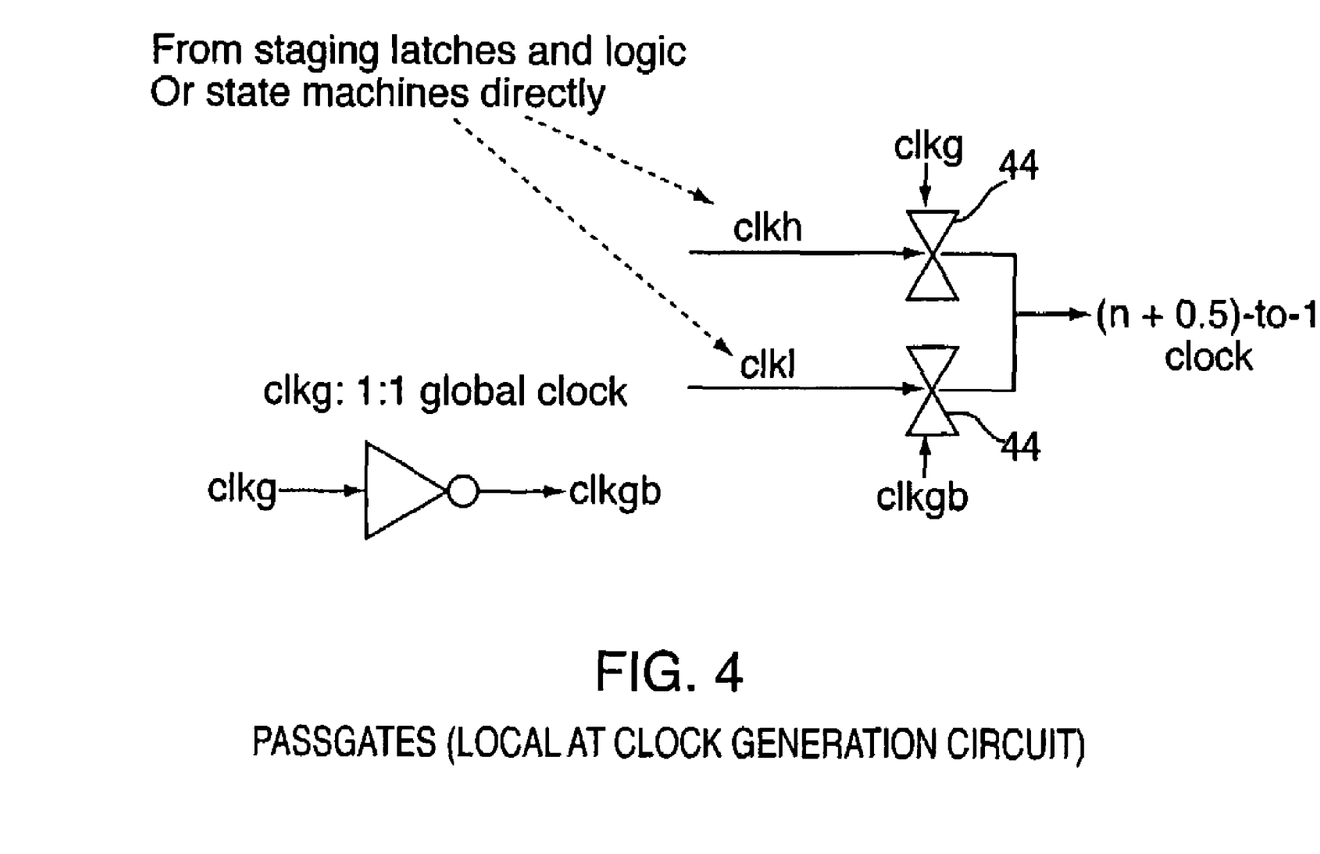
FIG. 4 illustrates one example of a local passgate circuit.

FIG. 3 illustrates one example of staging latches and logic for (n+0.5)-to-1 clock generation. The staging latches and logic comprised of one or multiple latches for generating delayed control signal of two phases, L1 and L2. A global clock signal clkg and inverted global clock signal clkgb are provided to gate the latches 36 to generate delayed control signals l1 ... lN. The first staging latches 36 also serve the purpose of aligning the timing of the control signals. Combination logic 38 is positioned between each pair of connected latches 36. The combination logic 38 between latches 36 may be used to alter the control signal patterns. Alternatively, the combination logic 38 can simply pass through the control signals without alteration but serve as a delay element to prevent early-mode timing fails. A group combination logic 40 combines the delayed or altered control signals l1 ... lN from all the latches 36 to generate the clock high signal (clkh) and clock low signal (clkl) to be sent to the passgates. The clock high signal (clkh) and clock low signal (clkl) have patterns derived from a waveform of a target divided ratio clock. The clock high signals and clock low signals have patterns that match the targeted divided clock frequency and duty cycle FIG. 4 illustrates one example of a local passgate circuit. The clock high signal clkh is passed through the passgates 44 when the global clock clkg is high as shown in FIG. 4. The clock low signal clkl is passed by passgates 44 when the global clock signal clkg is low as shown in FIG. 4. The global clock signal clkg is the 1:1 global clock, which is the reference of the generated ratio clock. The output of the passgates 44 is the (n+0.5)-to-1 ratio clock.

Figure 5:
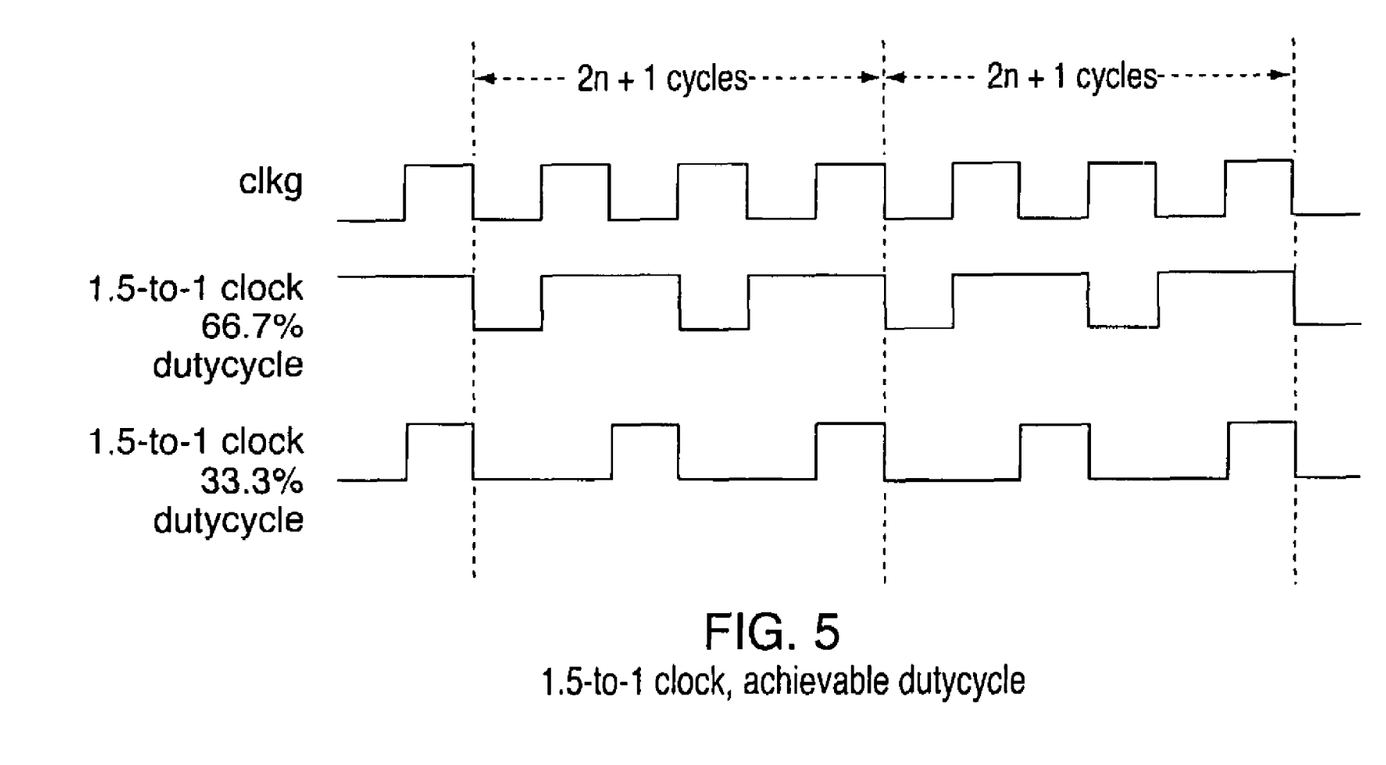
FIG. 5 illustrates one example of timing diagrams of two 1.5-to-1 clocks with different duty cycles.

FIG. 5 illustrates one example of timing diagrams of two 1.5-to-1 clocks with different duty cycle. Since the clock high signal clkh is passed by passgates 44 when the global clock signal clkg is high, the clock high signal clkh needs to be stable when the global clock signal clkg is high. That means that the clock high signal clkh is sourced from an L2 latch having a first phase delay shown in FIG. 3. For the same reason, the clock low signal clkl is sourced from an L1 latch having a second phase delay as shown in FIG. 3.

With the above basic structure, the number of staging latches 36, the control signal pattern generated from the state machine 30 and the combination logic 38 can be manipulated to achieve the intended (n+0.5)-to-1 clock with desired duty cycle. Since the passgates 44 can only switch at rising or falling edges of the global clock clkg, the achievable duty cycle is an increment of 100/(2n+1)%.

Figure 6:
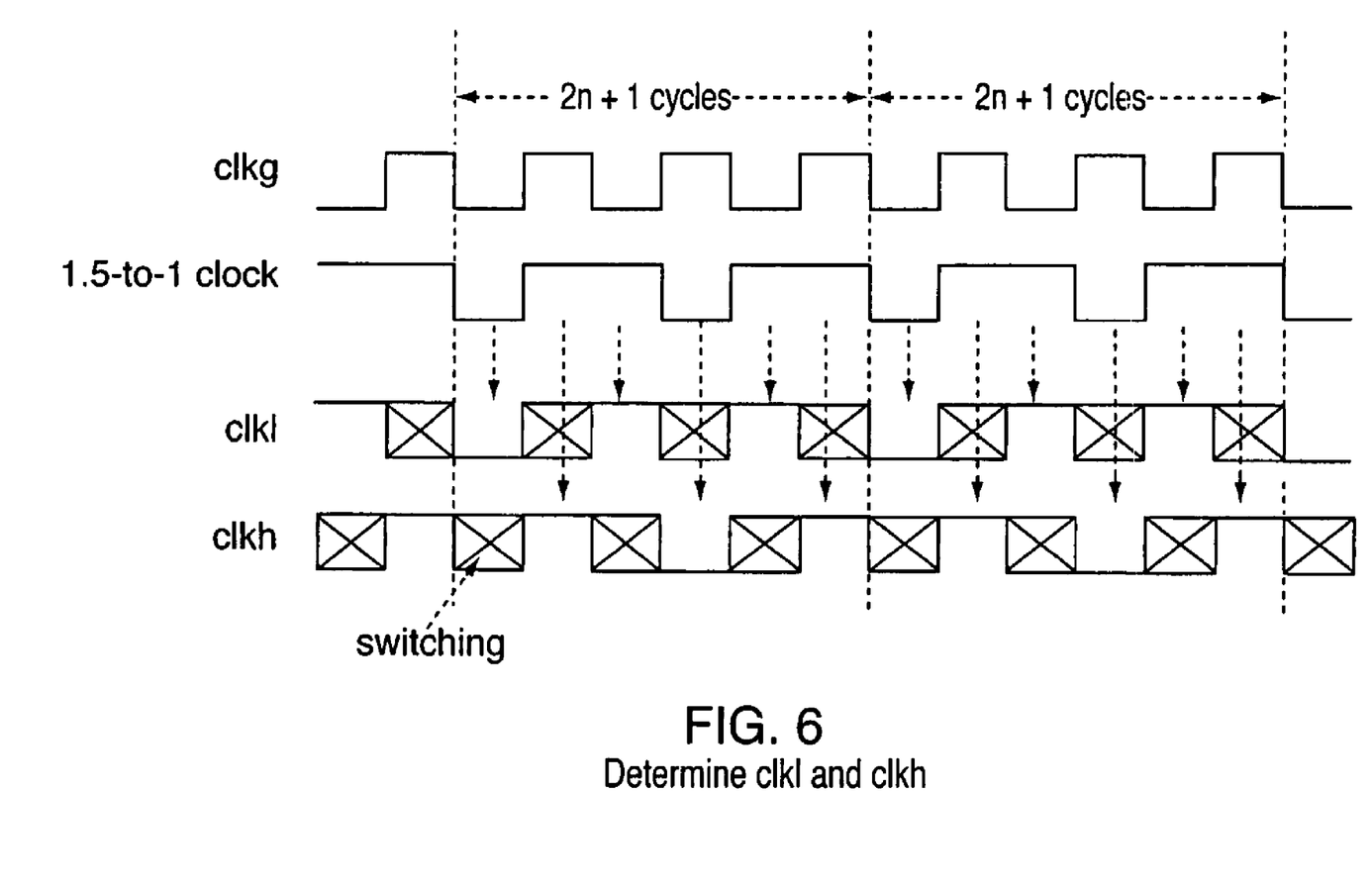
FIG. 6 illustrates one example of a method of determining required clkl and clkh pattern.

FIG. 6 illustrates one example of a method of determining a clock low signal clkl and clock high signal clkh pattern. First, the desired pattern of (n+0.5)-to-1 clock is determined, for example: 1.5-to 1 clock with a 66.7% duty cycle. Then, the required clock low signal clkl and clock high signal clkh patterns are determined that will generate the (n+0.5)-to-1 clock. The clock low signal clkl is valid when the global clock signal clkg is low. The clock high signal clkh is valid when global clock signal clkg is high.

Figure 7:
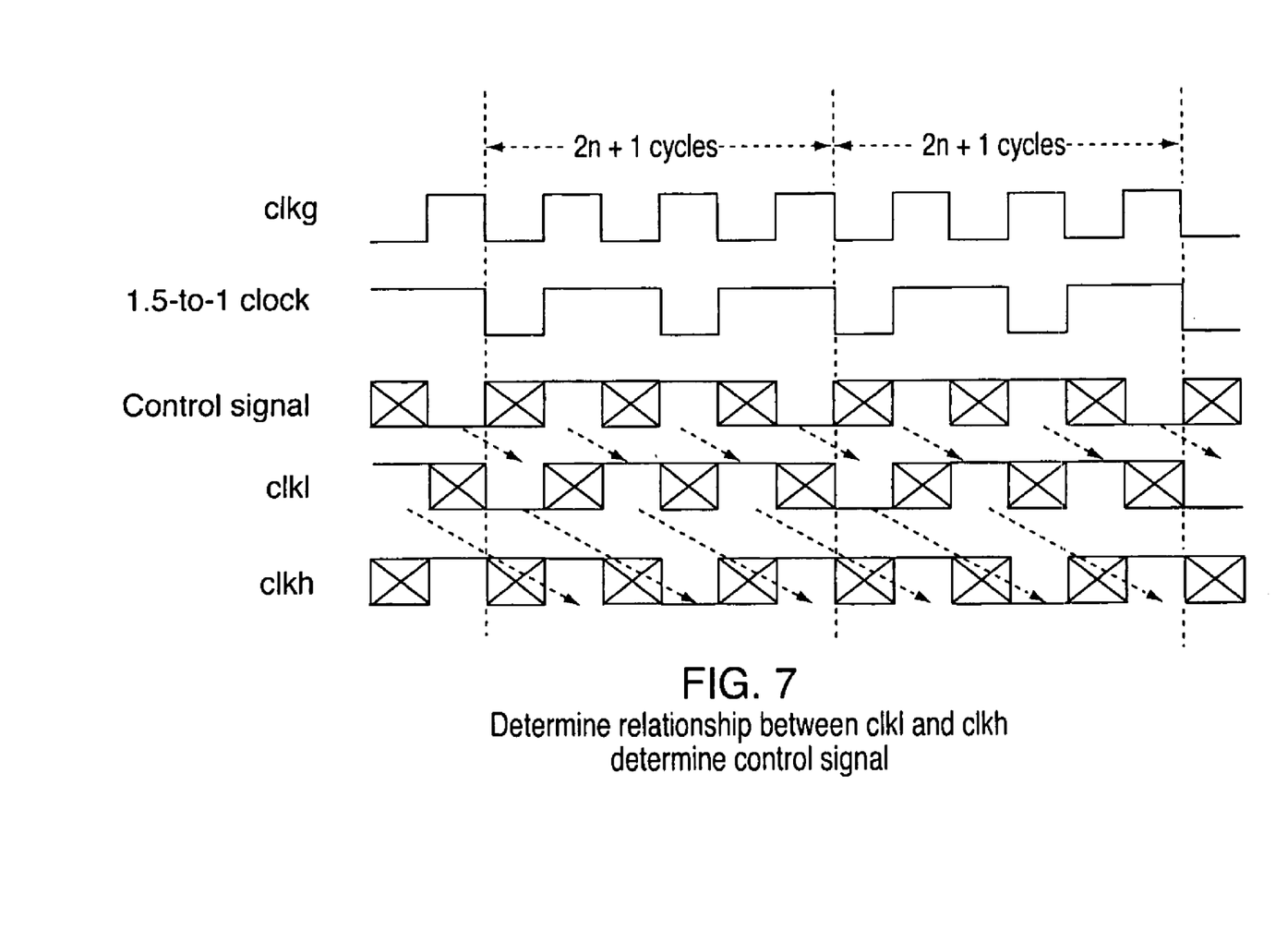
FIG. 7 illustrates one example of determining the timing relationship of clkl and clkh.

FIG. 7 illustrates one example of determining the timing relationship of the clock low signal clkl and the clock high signal clkh. If a two-state-machine option is used as shown in FIG. 1, each state machine 30 will generate the needed clock low signal clkl and clock high signal clkh patterns. No staging latch is required in the embodiments with multiple state machines. If staging latches and logic are used, the relationship between the clock low signal clkl and the clock high signal clkh is determined. A single state machine 30 with staging latches 34 instead of two state machines 30 may be used due to the patterns of the clock low signal clkl and the clock high signal clkh being related. In the example above, the clock low signal clkl has the pattern of 011011, while the clock high signal clkh has 101101. The clock high signal clkh can be obtained by delaying the clock low signal clkl by 1.5 global clock signal clkg cycles.

Figure 8:
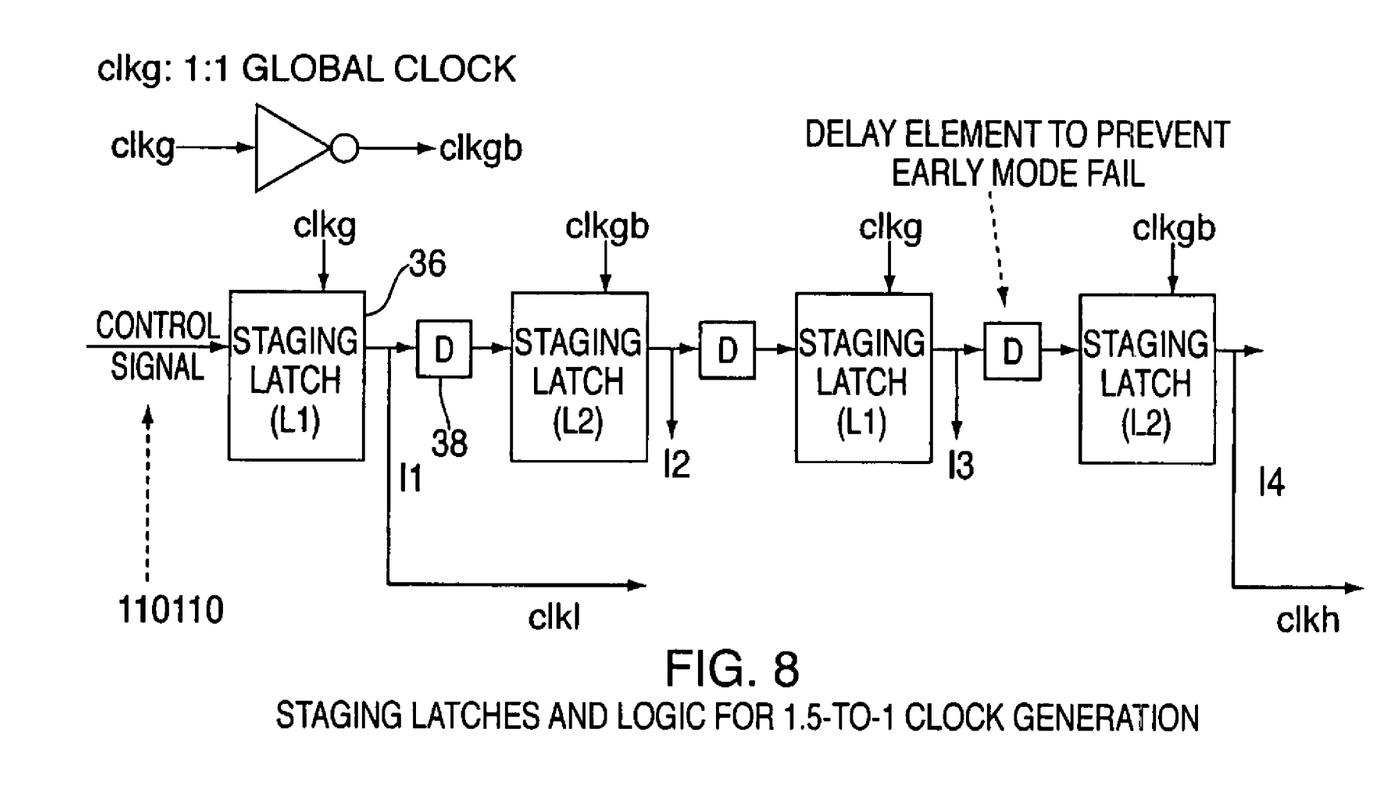
FIG. 8 illustrates one example of a circuit for generating 1.5-to-1 clock with 4 latches.

FIG. 8 illustrate one example of a circuit for generating 1.5-to-1 clock defined in FIG. 6 with 4 latches. The logic circuitry 38 (delay elements in this example), number of staging latches 36, and control signal pattern are selected to generate the clock low signal clkl and the clock high signal clkh. In the example above, the clock low signal clkl will be taken directly from delayed control signal l1, while the clock high signal clkh is taken from delayed control signal l4. No group combination logic 40 is used in this example. A similar structure in FIG. 8 may be used to generate 2.5-to-1 clock by adding two more staging latches. For (n+0.5)-to-1 clock, 2n+2 staging latches may be used.

Figure 9:
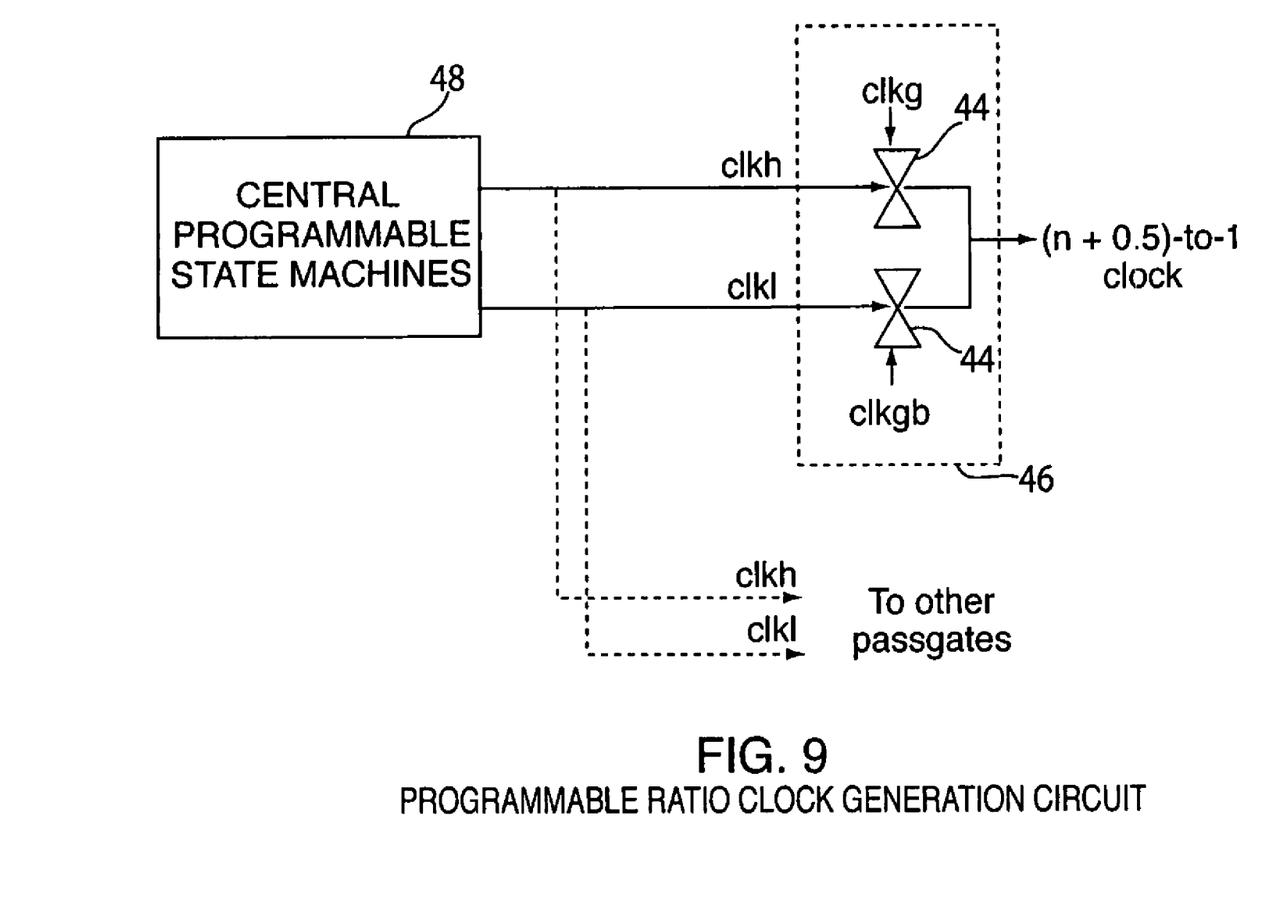
FIG. 9 illustrates centralized programmable state machines and local clock generation circuits.

The staging latch circuit is generally associated with the frequency of the clock to be generated. If the completely centralized approach is taken as shown in FIG. 9, the local clock generation circuits 46 only contain passgates 44. The frequency and duty cycle of the generated clock become completely programmable by controlling the state machines 48 in the central clock control unit. This may be a solution of choice if complete programmability of the ratio clock is desired.

The table below shows examples of generating different ratio clocks with different clock low signal clkl and clock high signal clkh patterns. Any n/2 clock may be generated by changing the clock low signal clkl and the clock high signal clkh generated from the central state machines. The change of frequencies can even be done dynamically during chip operations.

| clkl | clkh | ratio clock |
|---|---|---|
| 000000 | 111111 | 1-to-1 |
| 111111 | 000000 | 1-to-1 inverted |
| 011011 | 101101 | 1.5-to-1 |
| 010101 | 111111 | 2-to-1 |
| 01111 | 11011 | 2.5-to-1 |

Figure 10:
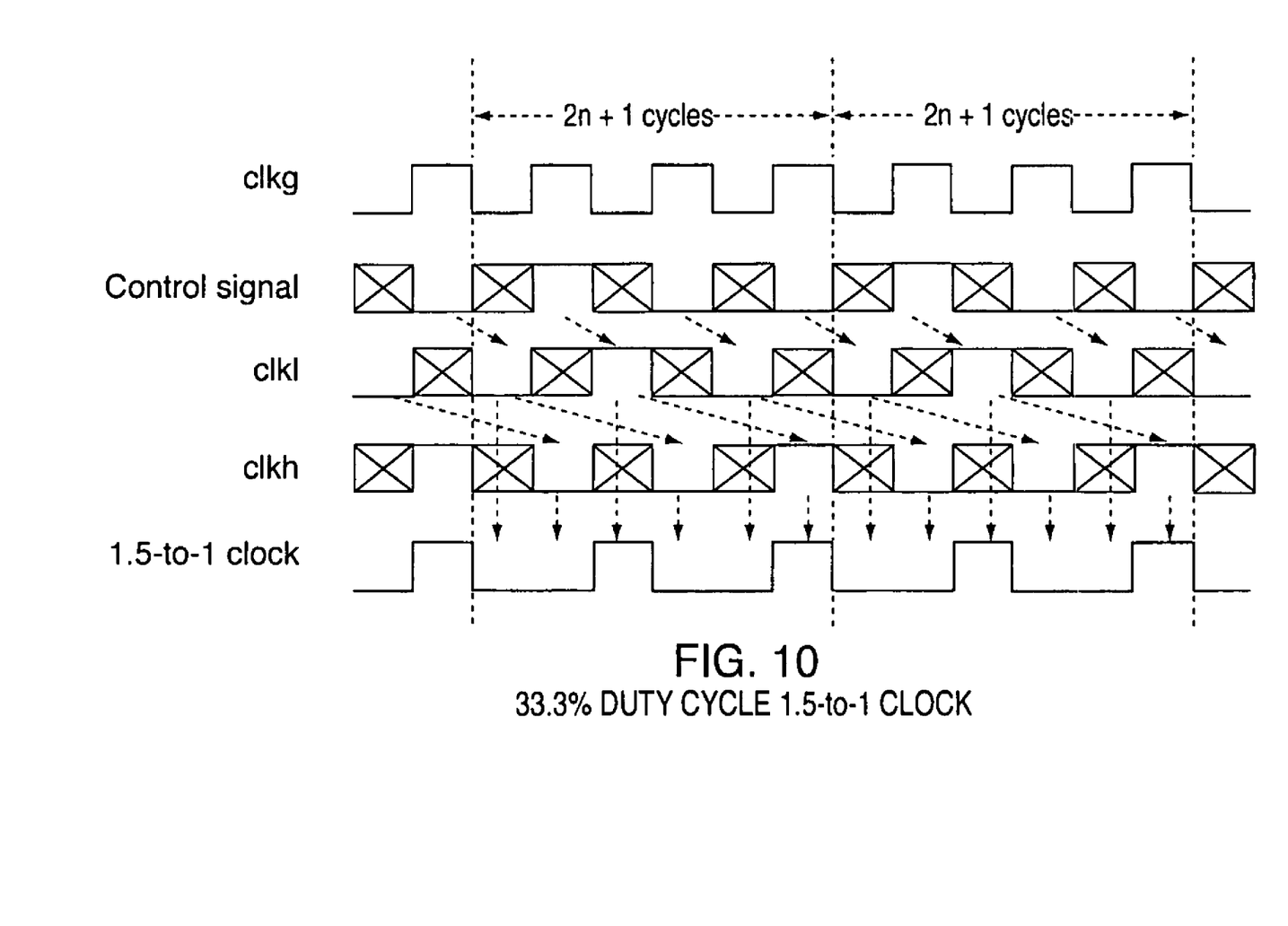
FIG. 10 illustrates one example of a 1.5-to 1 clock with 33.3% duty cycle.
Figure 12:
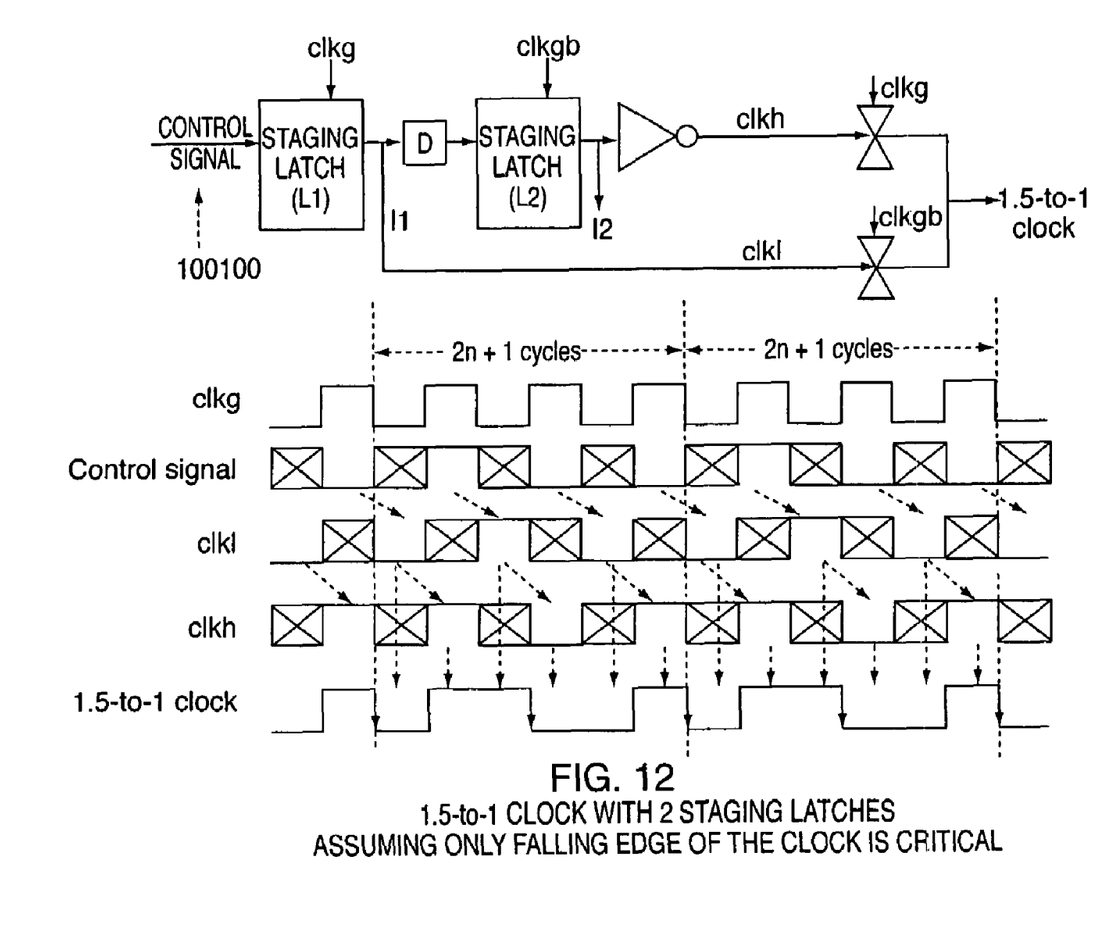
FIG. 12 illustrates one example of a circuit for generating 1.5-to-1 clock with 2 latches and the associated timing diagram.

FIG. 10 illustrate one example of a 1.5-to1 clock with 33.3% duty cycle. With the staging latch circuit shown in FIG. 8, the input control signal may be used to control the duty cycle of (n+0.5)-to-1 clock. Since there is no change to the staging latch circuit, this can be achieved by reconfiguring or controlling the centralized state machine. FIG. 12 shows an example with an input control signal pattern of 100100 to alter the duty cycle.

Figure 11:
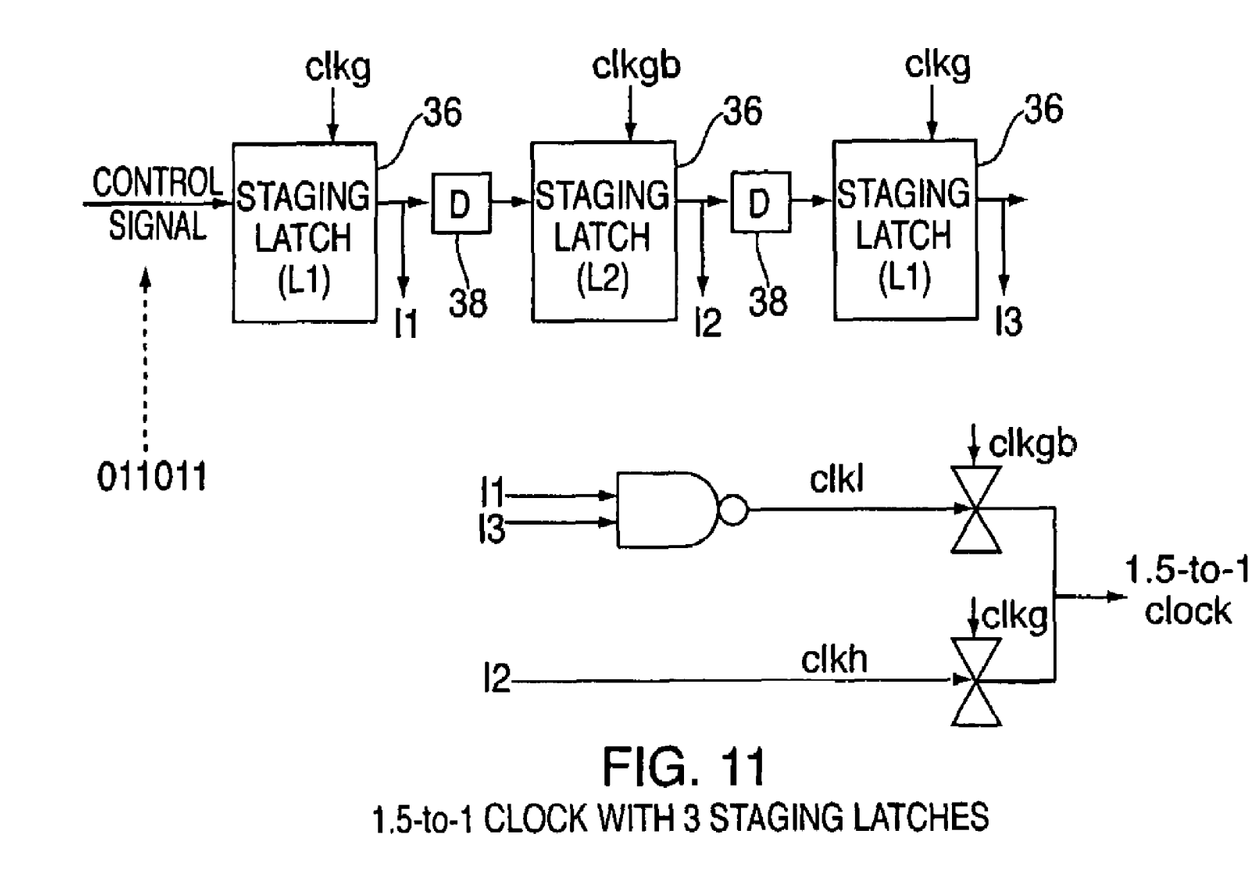
FIG. 11 illustrates one example of a circuit for generating 1.5-to-1 clock with 3 latches.

FIG. 11 illustrates one example of a circuit for generating a 1.5-to-1 clock with 3 latches. If the staging latches and logic reside inside the local clock generation circuit, further compaction of the circuit may be desired to save area. Extra logic may be added to the combination logic part to reduce the number of staging latches required. The extra logic required depends on the intended frequency and duty cycle of (n+0.5)-to-1 clock. The example in FIG. 11 shows 1.5-to-1 clock implementation with only 3 staging latches 36.

FIG. 12 illustrate one example of a circuit for generating 1.5-to-1 clock with 2 latches and the associated timing diagram. This provides an even more compact circuit, using only 2n staging latches to generate (n+0.5)-to-1 clock if only the falling or rising of the edge of the clock is important and it's acceptable to have varying duty cycle on the generated clock.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. Circuitry for locally generating a ratio clock on a chip, comprising:
    circuitry for generating a global clock signal having a global clock cycle;
    a state machine including a counter going through a complete cycle in response to a non-integer number of global clock cycles, the state machine generating a control signal in response to the counter;
    staging latches receiving the control signal and generating a clock high signal and a clock low signal, the clock high signal and clock low signal having patterns derived from a waveform of a target divided ratio clock, the clock high signal and clock low signal having patterns that match the targeted divided clock frequency and duty cycle;
    a local pass gate receiving the clock low signal and the clock high signal and generating an (n+0.5)-to-1 clock signal in response to the global clock signal, the clock high signal and the clock low signal.

2. The circuitry of claim 1 further comprising combination logic positioned between pairs of staging latches.

3. The circuitry of claim 2 wherein the combination logic is a delay.

4. The circuitry of claim 1 further comprising group combination logic for receiving delayed control signals from the staging latches, the group combination logic generating the clock low signal and clock high signal.

5. The circuitry of claim 1 wherein the state machine includes multiple state machines, each of which generates different control signal patterns.

6. The circuitry of claim 5 further comprising a multiplexer for selecting between the different control signal patterns.

7. The circuitry of claim 1 wherein equal delays are maintained between the state machine and local clock generation circuits including the passgates.

8. The circuitry of claim 2 wherein the pair of latches are clocked by alternate clock phases.

9. The circuitry of claim 1 wherein a first staging latch is used to synchronize timing.

10. The circuitry of claim 1 wherein the staging latches include 4 staging latches, one staging latch directly generating the clock low signal and another staging latch directly generating the clock high signal for generating a 1.5-to-1 ratio clock.

11. The circuitry of claim 10 further comprising a delay positioned between a first staging latch and a second staging latch, a delay position between the second staging latch and a third staging latch and a delay positioned between the third staging latch and the fourth staging latch, the first and third staging latches being clocked by a first phase of the global clock, the second and fourth staging latches being clocked by a second phase of the global clock signal, the second phase being opposite the first phase, the first staging latch generating the clock low signal and the fourth staging latch generating the clock high signal for generating a 1.5-to-1 ratio clock.

12. The circuitry of claim 4 wherein the staging latches include 3 staging latches and the group combination logic includes a NAND gate.

13. The circuitry of claim 12 further comprising a delay positioned between a first staging latch and a second staging latch and a delay position between the second staging latch and a third staging latch, the output of the first staging latch and the third staging latch being applied to the NAND gate to generate the clock low signal, the output of the second staging latch defining the clock high signal.

14. The circuitry of claim 4 wherein the staging latches include 2 latches and the group combination logic is an inverter.

15. The circuitry of claim 14 further comprising a delay position between a first staging latch and a second staging latch, the output of the first staging latch defining the clock low signal and the output of the second staging latch being applied to the inverter to generate the clock high signal.

* * * * *